United States Patent
Yu et al.

(10) Patent No.: US 8,751,846 B2
(45) Date of Patent: *Jun. 10, 2014

(54) POWER SUPPLY SELECTOR AND POWER SUPPLY SELECTION METHOD

(75) Inventors: Kai Yu, Shenzhen (CN); Wangsheng Xie, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 430 days.

This patent is subject to a terminal disclaimer.

(21) Appl. No.: 13/193,929

(22) Filed: Jul. 29, 2011

(65) Prior Publication Data

US 2012/0025896 A1    Feb. 2, 2012

(30) Foreign Application Priority Data

Jul. 31, 2010    (CN) .......................... 2010 1 0244882

(51) Int. Cl.
*G06F 1/00*    (2006.01)
*G06F 1/32*    (2006.01)

(52) U.S. Cl.
USPC ........................... 713/340; 713/330; 327/407

(58) Field of Classification Search
USPC .................... 713/330, 340; 327/407
See application file for complete search history.

(56) References Cited

U.S. PATENT DOCUMENTS

| | | | |
|---|---|---|---|
| 4,788,450 A * | 11/1988 | Wagner | 307/64 |
| 5,886,561 A | 3/1999 | Eitan et al. | |
| 7,142,038 B2 | 11/2006 | Baglin | |
| 7,307,468 B1 | 12/2007 | Vasudevan | |
| 7,683,597 B2 | 3/2010 | Shimada et al. | |
| 7,750,504 B2 * | 7/2010 | Lee | 307/80 |
| 8,264,801 B2 * | 9/2012 | Riedel et al. | 361/18 |
| 2003/0168916 A1 * | 9/2003 | Matsuda et al. | 307/75 |
| 2005/0280313 A1 | 12/2005 | Baglin et al. | |
| 2005/0280447 A1 * | 12/2005 | Curtis et al. | 327/74 |
| 2009/0083556 A1 * | 3/2009 | Zimek et al. | 713/310 |

FOREIGN PATENT DOCUMENTS

| | | |
|---|---|---|
| CN | 101557122 | 10/2009 |
| CN | 101604867 | 12/2009 |
| WO | 2009/069092 | 6/2009 |

OTHER PUBLICATIONS

Leping Xu et al. CN101557122 A, Duplicate supply selection cirucit (Google Translation of doc), Oct. 14, 2009.*
Chinese Office Action mailed Apr. 9, 2013 for corresponding Chinese Application No. 201010244882.8.
Second Chinese Office Action issued Oct. 25, 2012 in corresponding Chinese Patent Application No. 201010244882.8.

(Continued)

*Primary Examiner* — Kim Huynh
*Assistant Examiner* — Zahid Choudhury
(74) *Attorney, Agent, or Firm* — Staas & Halsey LLP (57) ABSTRACT

In the field of electronic technologies, a power supply selector and a power supply selection method are provided. The power supply selector includes: a first selection module, configured to select a power supply from multiple candidate power supplies; a control module, coupled to the first selection module, and configured to use the power supply selected by the first selection module as a power supply, and compare voltages of the multiple candidate power supplies to generate a control signal of each candidate power supply; and a second selection module, coupled to the control module, and configured to select a power supply for output in the multiple candidate power supplies under the control of the control signal of each candidate power supply. The technical solution is used to select a power supply from multiple candidate power supplies.

16 Claims, 9 Drawing Sheets

(56) References Cited

OTHER PUBLICATIONS

Notice of Allowance mailed Mar. 19, 2012, in corresponding U.S. Appl. No. 13/250,126.

Office Action, mailed Dec. 21, 2011, in corresponding U.S. Appl. No. 13/250,126.

First Chinese Office Action issued Aug. 2, 2012 in corresponding Chinese Patent Application No. 201010244882.8.

* cited by examiner

POWER SUPPLY SELECTOR AND POWER SUPPLY SELECTION METHOD

CROSS-REFERENCE TO RELATED APPLICATIONS

This application claims priority to Chinese Patent Application No. 201010244882.8, filed on Jul. 31, 2010, which is hereby incorporated by reference in its entirety.

FIELD OF THE INVENTION

The present invention relates to the field of electronic technologies, and in particular, to a power supply selector and a power supply selection method.

BACKGROUND OF THE INVENTION

Figure 1:
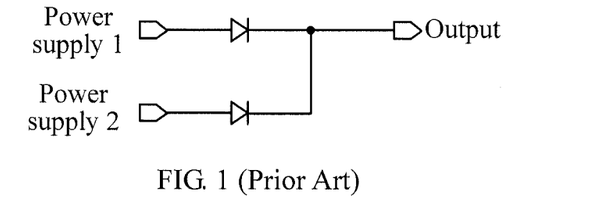
FIG. 1 is a schematic diagram of a power supply selection circuit with a diode structure in the prior art.

A power supply selector can select a power supply and perform switching among multiple power supplies, and the selector is widely used in various kinds of battery backup power management systems, such as a battery charger management chip, a battery backup memory chip, a battery backup microprocessor, and a network processor chip. Taking a lithium battery charger management chip as an example, two power supplies are usually connected to a charger management circuit with a single lithium battery or multiple lithium batteries connected in series: one is an external power supply, and the other is a battery power supply. When the external power supply is on, the external power supply provides energy for the load; and when the external power supply is off, the battery provides energy for the load. Multiple power supplies are usually connected to a charger management circuit with multiple lithium batteries connected in parallel: one is an external power supply, and the others are battery power supplies. Therefore, in various kinds of lithium battery charger management circuits, it is necessary to use a power supply selection circuit to select a power supply from multiple power supplies to supply power for the battery charger management circuits. Generally, the power supply selected by the power supply selection circuit is the supply with the highest voltage in the multiple power supplies. Such a circuit can have two basic functions. The first function is to compare voltages of the multiple power supplies, so as to select one power supply with the highest voltage; and the second function is to transmit the selected power supply efficiently, so as to prevent current from flowing between the power supplies. Currently, two solutions for implementing a power supply selection circuit are used in the field: Solution 1: a power supply selection circuit with a diode structure; and Solution 2: a power supply selection circuit with a switch transistor structure. FIG. 1 shows a two-power supply selection circuit with a diode structure in the prior art. In the circuit, positive ends of two diodes are connected to each power supply respectively, and negative ends of the two diodes are connected together for output. With the circuit, the diode with the highest power supply voltage is turned on, and the other one of diodes is not turned on, so power supply is selected. Meanwhile, such a structure also can prevent current from flowing from a power supply with a high voltage level to a power supply with a low voltage level.

In addition to ordinary diodes, some improved structures are also adopted to implement a multi-power supply selection circuit. For example, Schottky diodes can be employed to replace the ordinary diodes, or transistors can be connected to form diodes which are employed to replace the ordinary diodes. However, no matter what diode structure is adopted, the turned-on diode has a certain voltage drop. The voltage drop of the ordinary diodes and the diode-connected metal oxide semiconductor (MOS) transistors is relatively large, which is 0.5-0.6 V, and the voltage drop of the Schottky diodes is relatively small, which is 0.2-0.3 V. Such a voltage drop is unfavorable, particularly for a low-voltage memory system.

Figure 2:
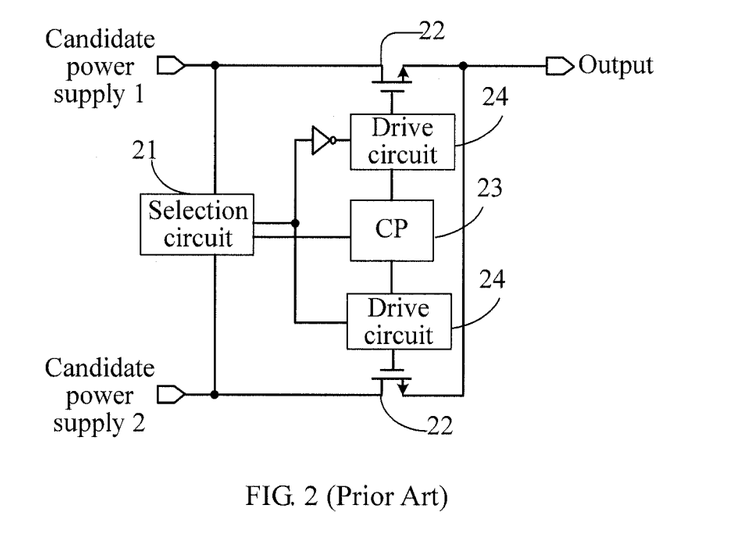
FIG. 2 is a schematic diagram of a power supply selection circuit with a switch transistor structure in the prior art.

A power supply selection circuit with a switch transistor structure proposed in the prior art is shown in FIG. 2, which can reduce the influence of the voltage drop on the circuit in low voltage applications. The design difficulty of such a structure is how to prevent current flowing between power supplies. Secondly, how to select the type of a switch transistor also needs to be taken into account. A bipolar or MOS transistor may be selected as a discrete switch. The principle is as follows. A selection circuit 21 makes a selection between two candidate power supplies, and signals generated by the selection circuit 21 are used to control the status of each n-channel metal oxide semiconductor (NMOS) switch 22. The power supply voltage output by the selection circuit can be raised to a certain voltage value through an internal charge pump (CP) 23, then the power supply voltage passes through a drive circuit 24, and the output signal is a drive signal of a gate of the NMOS switch. Because a threshold voltage will be lost when the NMOS switch transfers the high voltage level, the raised voltage value should be at least one threshold voltage higher than the highest power supply voltage. Such a design can increase the overdrive voltage of the switch transistor, reduce the on-resistance of the switch transistor, and decrease voltage transmission loss. However, the CP is introduced into the system and meanwhile the system also needs to be equipped with a clock circuit for driving the CP, so that not only the complexity of the circuit is increased but also the power consumption of the system is increased.

The power supply selection to output an accurate power supply voltage without affecting the performance such as the power consumption of the system challenges the design of the power supply selection circuit.

SUMMARY OF THE INVENTION

Embodiments of the present invention provide a power supply selector and a power supply selection method, so as to select a power supply from multiple candidate power supplies.

An embodiment of the present invention provides a power supply selector, where the power supply selector includes:
 a first selection module, configured to receive multiple candidate power supplies and select a power supply from the multiple candidate power supplies as an internal power supply;
 a control module, coupled to the first selection module and configured to receive the multiple candidate power supplies, use the internal power supply as a power supply, and compare voltages of the multiple candidate power supplies to generate a control signal of each candidate power supply in the multiple candidate power supplies; and
 a second selection module, coupled to the control module and configured to receive the multiple candidate power supplies, and select a power supply from the multiple candidate power supplies as an output power supply under the control of the control signal of each candidate power supply.

Another embodiment of the present invention provides a power supply selection method, where the power supply selection method includes:
 selecting a power supply from multiple candidate power supplies as an internal power supply;

supplying power for a control module by using the internal power supply, and comparing voltages of the multiple candidate power supplies by using the control module to generate a control signal of each candidate power supply; and selecting a power supply for output from the multiple candidate power supplies under the control of the control signal of each candidate power supply.

In the embodiments of the present invention, the power supply selector can preliminarily select a power supply to supply power for a control module, and generate a control signal by the control module through comparison, so as to control the process of selecting a power supply for output from multiple candidate power supplies, which reduces the influence of the voltage drop of the diodes on the power supply selection, and outputs an accurate power supply with low power consumption.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can obtain other drawings according to the accompanying drawings without making any creative efforts.

DETAILED DESCRIPTION OF THE EMBODIMENTS

The technical solutions of the embodiments of the present invention will be clearly described below with reference to the accompanying drawings. It is obvious that the embodiments to be described are only a part rather than all of the embodiments of the present invention. All other embodiments derived by persons of ordinary skill in the art based on the embodiments of the present invention without making creative efforts should fall within the protection scope of the present invention.

Figure 3:
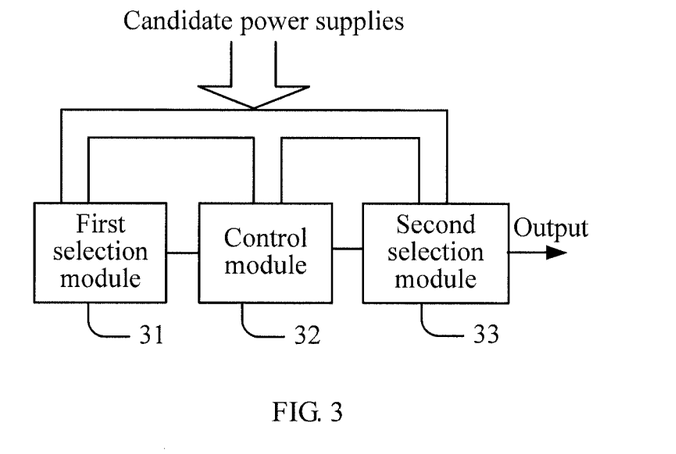
FIG. 3 is a schematic diagram of a power supply selector according to an embodiment of the present invention.

FIG. 3 is a schematic diagram of a power supply selector according to an embodiment of the present invention, where the power supply selector includes:

a first selection module 31, configured to select a power supply from multiple candidate power supplies;

a control module 32, coupled to the first selection module 31, configured to use the power supply selected by the first selection module 31 as a power supply, and compare voltages of the multiple candidate power supplies to generate a control signal of each candidate power supply; and a second selection module 33, coupled to the control module 32, configured to select a power supply for output from the multiple candidate power supplies under the control of the control signal of each candidate power supply.

The power supply selector according to this embodiment can generate a control signal, so as to control the selection of a power supply for output from multiple candidate power supplies, which reduces the influence of the voltage drop of the diodes on the power supply selection, and outputs a more accurate power supply. In addition, the circuit does not need to adopt a CP or a system clock, and can reduce the power consumption. The first selection module 31 makes a preliminary selection from the multiple candidate power supplies to supply power for the subsequent control module 32; therefore, it is unnecessary to realize precise selection, and the influence of the voltage drop of the diodes on the power supply transmission does not need to be taken into account in the design. Consequently, p-channel metal oxide semiconductor (PMOS) diodes with a gate and a drain connected to each other or other diodes can be adopted to implement the selection. The control module 32 takes the power supply selected by the first selection module 31 as a power supply and can generate a control signal through a simple comparison function, which does not require any complex circuit such as a CP and can reduce the power consumption. The second selection module 33 implements power supply selection under the control of the control signal, which can reduce the influence of the voltage drop of the diodes on the power supply transmission and output an accurate power supply without adopting a selection circuit of a diode structure in which a source and a drain are connected to each other.

In one implementation, the power supply output by the power supply selector is the power supply with the highest voltage in the multiple candidate power supplies. Certainly, if necessary, the power supply selector may also output the power supply with the lowest voltage in the multiple candidate power supplies, which is not limited to this embodiment.

Figure 4A:
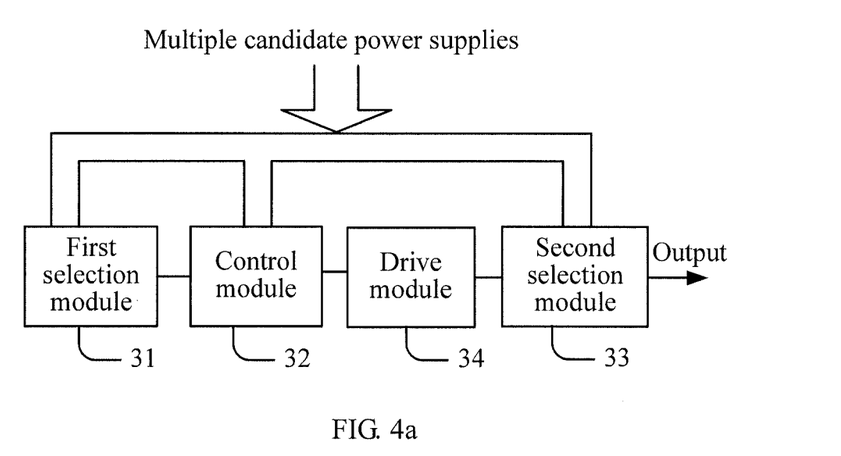
FIG. 4a is a schematic diagram of another power supply selector according to an embodiment of the present invention.

In addition, the power supply selector can be further improved to include a drive module 34. As shown in FIG. 4a, the control module 32 is coupled to the second selection module 33 through the drive module 34, and the drive module 34 drives the second selection module 33 through the output control signal of each candidate power supply, so as to improve the driving capability of the control signal of each candidate power supply. Persons skilled in the art generally use an inverter chain as a drive circuit to improve the driving capability of the signal.

Figure 4B:
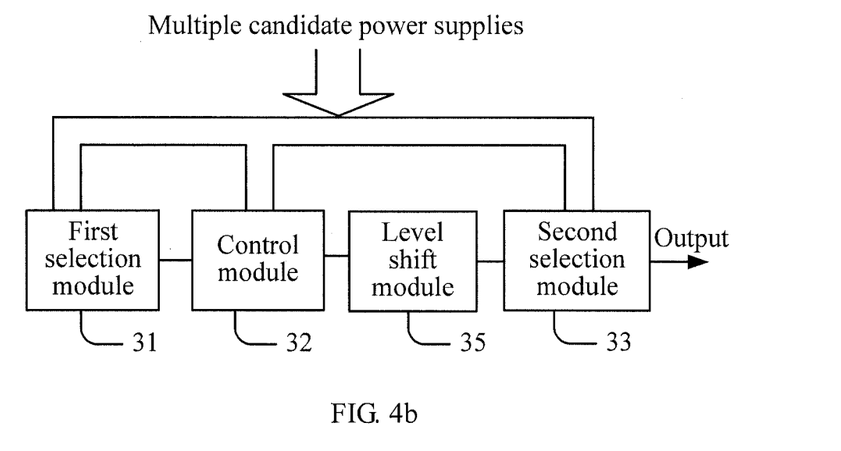
FIG. 4b is a schematic diagram of another power supply selector according to an embodiment of the present invention.

In addition, the power supply selector can be further improved to include a voltage shift module 35. As shown in FIG. 4b, the second selection module 33 is coupled to the control module 32 through the voltage shift module 35; and the voltage shift module 35 is configured to obtain the power supply fed back by the second selection module 33 as a power supply of the voltage shift module 35, and shift a high voltage level of the control signal of each candidate power supply to a voltage of the output power supply.

Figure 4C:
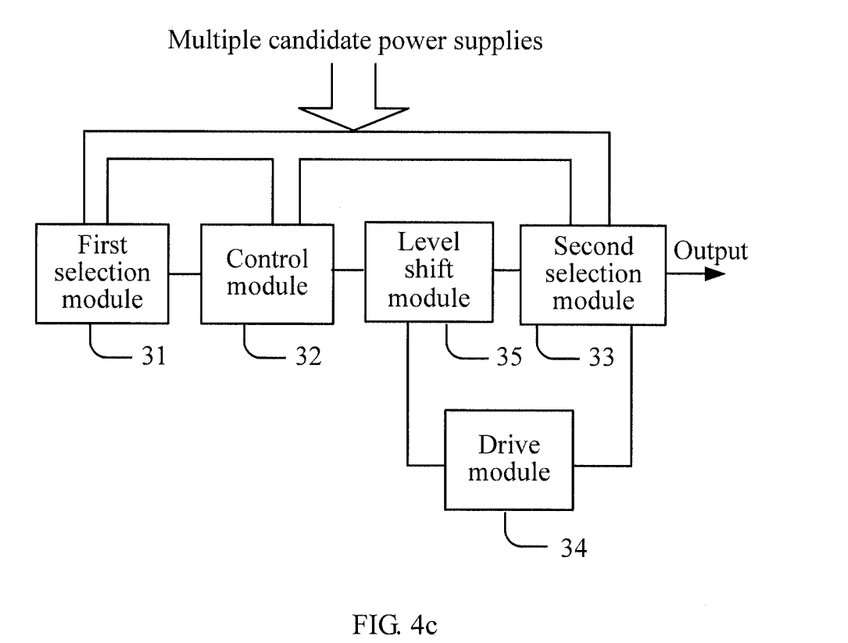
FIG. 4c is a schematic diagram of another power supply selector according to an embodiment of the present invention.

Certainly, the power supply selector may include the drive module 34 and the voltage shift module 35 in an application. As shown in FIG. 4c, the voltage shift module 35 receives the control signal output by the control module 32, and performs voltage shift on the control signal, and the voltage shift module 35 is coupled to the second selection module 33 through the drive module 34, so as to improve the driving capability of the control signal after the voltage shift, so that the second selection module 33 can control the power supply selection by using the control signal after the voltage shift with the improved driving capability.

For the convenience of introducing functions of the above modules, specific structures of some modules therein are given below. It should be noted that, many various structural connection structures may be used to implement the function of a module. In addition to the structures listed in the embodiments of the present invention, many other implementation means may be found in the prior art, so the implementation is not limited in the embodiments of the present invention.

In an example, the second selection module 33 may include a plurality of switches respectively connected to the candidate power supplies, and a control end of each switch receives the control signal of a candidate power supply for control, and decides whether to output the candidate power supply. In addition, the drive module 34 may be further configured to set an initial state of the plurality of switches in the second selection module 33. The form of the plurality of switches is not limited in this embodiment, for example, the switches may be PMOS switch transistors. In order to improve the performance, a switch performance optimization unit is introduced to optimize the performance of the PMOS switches on the basis of the PMOS switch transistors. The unit can be configured to adjust a substrate voltage of a switch coupled to the unit to the higher one between an input end voltage and an output end voltage of the switch.

Figure 5:
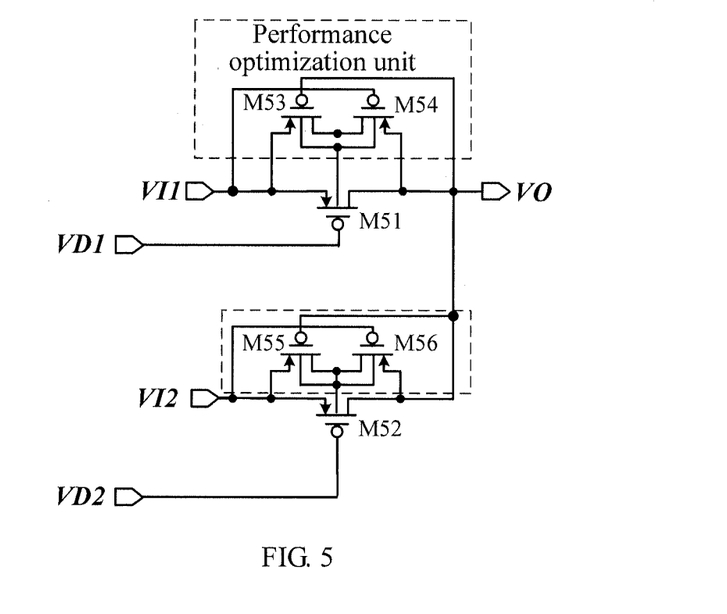
FIG. 5 is a schematic structural diagram of an embodiment of a second selection module according to the present invention.

The structure of an exemplary performance optimization unit may be illustrated as the structure in the dashed box in FIG. 5. Two additional PMOS transistors may be introduced, and the additional PMOS transistors can adjust a substrate voltage of the PMOS switch transistor to the higher one between a source voltage and a drain voltage of the PMOS switch transistor according to the source voltage and the drain voltage of the PMOS switch transistor. In the case based on an ordinary complementary metal oxide semiconductor (CMOS) process, the method can avoid turn-on of substrate diodes in the PMOS switch transistors and reduce a substrate leakage current. Certainly, other types of switches, such as NMOS switches or bipolar transistor switches, may also adopt a similar voltage adjustment way to make voltage adjustment. For the convenience of description, this example takes selection of a power supply from two supply signals as an example for description, but such description is only exemplary instead of limiting the present invention.

In the example of FIG. 5, the second selection module 33 needs to make a selection from two candidate power supplies, so two switches are included, which are respectively PMOS transistors M51 and M52. The performance optimization unit of the PMOS transistor M1 includes PMOS transistors M53 and M54, substrates of the PMOS transistors M51, M53, and M54 are connected to drains of the PMOS transistors M53 and M54, a source of the PMOS transistor M51, a source of the PMOS transistor M53, and a gate of the PMOS transistor M54 are connected to each other and connected to a candidate power supply VI1, and a drain of the PMOS transistor M51, a source of the PMOS transistor M54, and a gate of the PMOS transistor M53 are connected to each other and serve as an output VO. The performance optimization unit of the PMOS transistor M2 includes PMOS transistors M55 and M56, substrates of the PMOS transistors M52, M55, and M56 are connected to drains of the PMOS transistors M55 and M56, a source of the PMOS transistor M52, a source of PMOS transistor M55, and a gate of the PMOS transistor M56 are connected to each other and connected to another candidate power supply VI2, and a drain of the PMOS transistor M52, a source of the PMOS transistor M56, and a gate of the PMOS transistor M55 are connected to each other and serve as the output VO. Gates of the PMOS transistors M51 and M52 can respectively receive two control signals VD1 and VD2 with improved driving capability output by the preceding stage drive module 34. One of VD1 and VD2 have a high voltage level, so that one of the two PMOS switch transistors is turned on while the other is turned off, the turned on switch outputs the input signal to the output end VO, and the signal is usually the one with a higher voltage in the two candidate power supplies. For the performance optimization unit of the switch, other solutions may be found in the prior art, so the solution are not limited to the structure in this embodiment, and persons skilled in the art can adopt other circuits in the prior art to adjust the substrate voltage of the PMOS switch transistor to a higher one in the source voltage and the drain voltage of the PMOS switch transistor, which is not limited in this embodiment.

Certainly, if the drive module 34 is not used, the two switches can also directly receive control signals VS1 and VS2 output by the control module 32, which is not limited in this embodiment. Definitely, the second selection module 33 may have various structures, as long as the function of selecting one signal from multiple signals can be implemented. In the structure provided in this embodiment, the switch adopts a composite transistor structure, so as to avoid turn-on of substrate diodes in the PMOS switch transistors and reduce a substrate leakage current. In this embodiment, PMOS transistors are selected as switches. The PMOS transistors take a larger switch area to obtain the same on-resistance as the NMOS transistor switches, but the PMOS transistor switches have no voltage loss when producing the high voltage level. Therefore, the CP and the clock circuit are not essential if the PMOS transistor switches are used and the power consumption of the system can be reduced. It facilitates the implementation that the PMOS transistors are produced by elements adopting standard processes, so as to reduce the cost.

Figure 6:
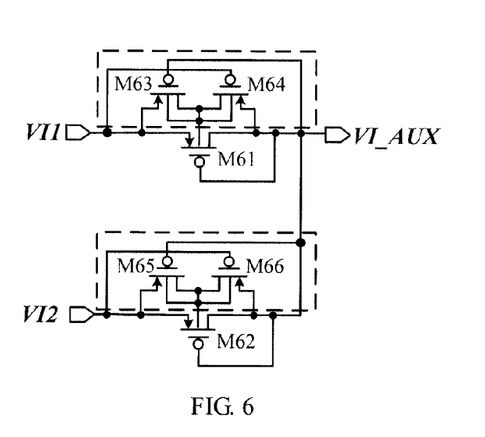
FIG. 6 is a schematic structural diagram of an embodiment of a first selection module according to the present invention.

One implementation structure of the first selection module 31 may be as shown in FIG. 6, which is similar to the structure shown in FIG. 5, and includes six PMOS transistors M61, M62, M63, M64, M65, and M66. The difference between the structure in FIG. 6 and the example in FIG. 5 is that the gates of the switch transistors M61 and M62 do not receive a control signal output from the preceding stage, but are respectively connected to their own drains to form two PMOS diodes. Therefore, it is unnecessary to use the control signal, so that the power supply with a higher voltage in the two candidate power supply signals VI1 and VI2 is output, and the output can be represented by VI_AUX. A certain voltage drop may exist between the output VI_AUX and input power supplies. The PMOS transistors M63 and M64 are configured to perform performance optimization on the PMOS diode M61, and the two transistors select one end with a higher voltage in the source end and the drain end of the PMOS diode and couple the selected end to the substrate of M61. The functions of the PMOS transistors M65 and M66 are similar as M63 and M64. Please refer to the embodiment shown in FIG. 5 for the specific working principle of the transistors, which is not repeated herein.

In the examples shown in FIG. 5 and FIG. 6, PMOS transistors are adopted to form switches or diodes. Certainly, NMOS transistors also can implement a similar function, and NMOS switches or NMOS diodes also can be optimized by using a performance optimization unit. The difference between the examples shown in FIG. 5 and FIG. 6 is that the performance optimization unit of the NMOS diodes is configured to adjust the substrate voltage of the NMOS diode to a lower voltage in the anode voltage and the cathode voltage of the NMOS diode instead of to a higher voltage. The performance optimization unit of the NMOS switches is configured to adjust the substrate voltage of the NMOS switch to a lower voltage in an input end voltage and an output end voltage of the NMOS switch.

In this embodiment, the first selection module 31 makes a preliminary selection by using a power supply selection circuit with a diode-connected PMOS transistor structure, which is easy to be integrated and that prevent current from flowing between power supplies.

Figure 7:
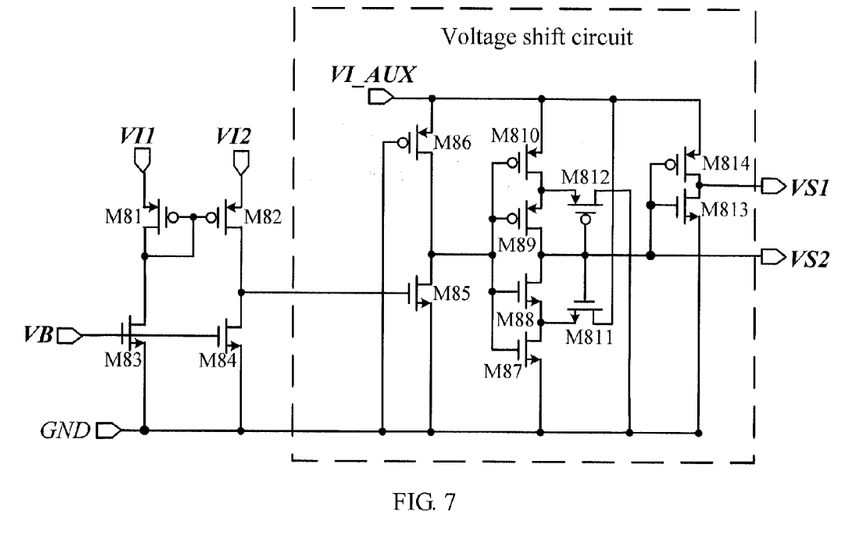
FIG. 7 is a schematic structural diagram of an embodiment of a control module according to the present invention.

The control module 32 can take the power supply VI_AUX preliminarily selected by the first selection module 31 as a power supply to implement the comparison for selecting a supply, and it may have multiple structures. For the convenience of comprehension, an embodiment of the present invention provides a schematic structural diagram of the control module 32. As shown in FIG. 7, the control module 32 includes: PMOS transistors M81 and M82, in which gates of the PMOS transistors M81 and M82 are connected to each other, and sources of the PMOS transistors M81 and M82 respectively receive the input of two candidate power supplies VI1 and VI2. A gate and a drain of M81 are connected to each other to form a PMOS diode. The PMOS transistors M81 and M82 may receive current from current sources. In FIG. 7, NMOS transistors M83 and M84 are used as current sources to supply power. Drains of the NMOS transistors M83 and M84 are respectively connected to the drains of M81 and M82, and gates of the NMOS transistors M83 and M84 are connected to a bias voltage VB, that is, M81, M82, M83, and M84 form a first stage of a comparator to generate a preliminary comparison result, so as to implement a preliminary comparison function. Certainly, the current sources may have other forms, such as a cascode structure, which is not limited in this embodiment.

In the control module 32, the comparison result formed by M81, M82, M83, and M84 is input to a subsequent voltage shift circuit, and the voltage shift circuit, as a second stage of the comparator, receives the comparison result, and is configured to receive the power supply selected by the first selection module 31 as a power supply, and shift the high voltage level in the comparison result to the voltage of the power supply selected by the first selection module 31, so as to obtain a control signal of one candidate power supply. This embodiment provides a possible structure of a voltage shift circuit. As shown in the dashed box in FIG. 7, the voltage shift circuit is optimized, which not only can implement the voltage shift function but also can implement shaping and noise cancellation. In the voltage shift circuit in the dashed box of FIG. 7, an NMOS transistor M85 and a PMOS transistor M86 form an inverter structure, configured to implement the voltage shift function, which receives an input signal from the preceding stage comparator, and shifts a high voltage level in the comparison result to the voltage VI_AUX of the power supply selected by the first selection module 31. A gate of the NMOS transistor M85 is connected to the drain of M84, a drain of the NMOS transistor M85 is connected to a drain of the PMOS transistor M86, and a source of M85 and a gate of M86 are connected to the ground (GND). After the voltage shift, the control module 32 may be further optimized, for example, a circuit for noise cancellation and shaping may be added to the control module 32. In the control module 32 of FIG. 7, two NMOS transistors M87 and M88 and two PMOS transistors M89 and M810 form an inverter structure, and an input of the inverter is connected to the drain of M85. An output of the inverter formed by M87, M88, M89, and M810 is connected to another inverter, and the another inverter is formed by an NMOS transistor M813 and a PMOS transistor M814. An input and an output of the CMOS inverter formed by M813 and M814 respectively serve as two control signals VS1 and VS2 for a subsequent second selection module 33. The circuit structure may further include: an NMOS transistor M811 and a PMOS transistor M812, as shown in FIG. 7. A drain of M811 is connected to VI_AUX, and a source of M811 is connected to a drain of M87; a drain of M812 is grounded, and a source of M812 is connected to a drain of M810; and gates of M811 and M812 are connected to each other and are connected to an output end of the input control signal VS2. Accordingly, the transistors M87 to M812 form a Schmitt trigger. The Schmitt trigger is configured to implement shaping and noise cancellation. Persons skilled in the art can further improve the Schmitt trigger shown in FIG. 7, and other possible circuits with the noise cancellation function are not listed in this embodiment.

The control module 32 in this embodiment implements a comparison function, the subsequent voltage shift circuit unifies the voltages to VI_AUX, for implementing selection from two candidate power supplies, and when the voltage of the candidate power supply VI1 is higher than that of the candidate power supply VI2, the output VS1 is a high voltage level VI_AUX, the output VS2 is a low voltage level, so as to implement control over the subsequent second selection module 33. Two input voltages are compared in this embodiment, and the comparison result may serve as a subsequent control signal. Certainly, the control module 32 implemented by the comparator structure may be implemented by other structures, which will not be further introduced in this embodiment.

Figure 8:
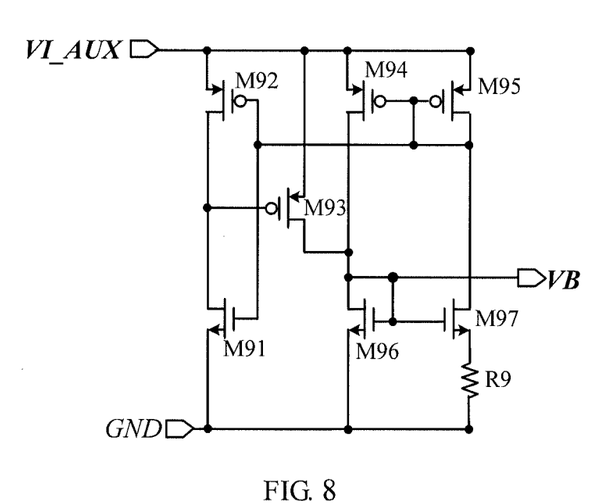
FIG. 8 is a schematic structural diagram of an embodiment of a biasing unit according to the present invention.

The structure of the control module 32 can be provided with a bias VB by a biasing circuit. FIG. 8 is a schematic diagram of a biasing unit further provided in this embodiment. The biasing unit also supplies power with VI_AUX, and generates a bias voltage VB of the control module 32. An NMOS transistor M91 and a PMOS transistor M92 form an inverter structure, and an output of the inverter is connected to a gate of the PMOS transistor M93. A source of M93 is connected to VI_AUX, and a drain of M93 is connected to a drain of an NMOS transistor M96. M96 is connected to a gate of another NMOS transistor M97, and M96 itself is formed by an NMOS diode connection structure. A source of M97 is grounded through a resistor R9. Drains of M96 and M97 are respectively connected to drains of PMOS transistors M94 and M95, M95 is formed by a PMOS diode connection structure, and a drain of M95 serves as an input of the inverter formed by M91 and M92. In this embodiment, the biasing unit configured to provide the bias voltage VB for the control module 32 may have many other types, which has been described in the prior art and is not introduced in this embodiment. In one application, the biasing unit may be integrated in the first selection module 31, that is, the first selection module 31 supplies power for the control module 32 by preliminarily selecting one power supply, and besides, the first selection module 31 may further generate a bias voltage VB of the control module 32 through a circuit integrated in the first selection module 31, so as to provide the bias for a subsequent control module. Certainly, the biasing unit may be stand-alone instead of being integrated in the first selection module 31, which is not limited in this embodiment.

Figure 9:
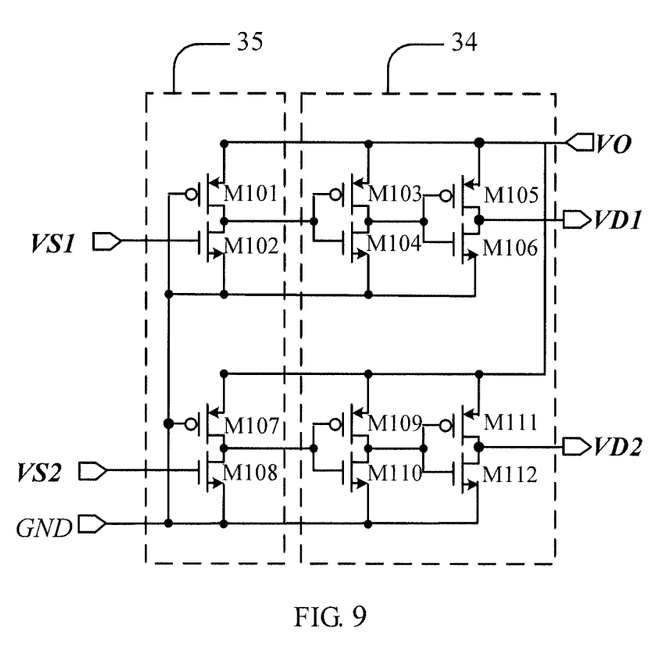
FIG. 9 is a schematic structural diagram of an embodiment of a circuit including a voltage shift module and a drive module according to the present invention.

To further improve the function of the embodiment of the present invention, the control module 32 may be subsequently connected to a drive module 34 configured to implement driving as shown in FIG. 4a, and may be connected to the voltage shift module 35 as shown in FIG. 4b. Certainly, the drive module 34 may also provide the voltage shift function while improving the driving capability of the control signal, that is, the voltage shift function and the driving function may be implemented in the same module. No matter whether the voltage shift function and the driving function are implemented respectively in two modules or are integrated in the same module, the technical solution of this embodiment is not substantially changed. FIG. 9 is a schematic structural diagram of an embodiment of a circuit including a voltage shift module 35 and a drive module 34, in which the voltage shift module 35 and the drive module 34 are respectively configured to implement the voltage shift function on the control signals and improve the driving capability of the control signals, the voltage shift module 35 and the drive module 34 are shown in FIG. 4c. Referring to FIG. 9, the voltage shift module 35 includes transistors M101, M102, M107, and M108, in which the PMOS transistor M101 and the NMOS transistor M102 form an inverter, configured to shift a voltage of a control signal. The specific structure is as follows. A gate of M102 serves as an input, a source of M102 is grounded, and a drain of M102 is connected to a drain of M101; a gate of M101 is grounded, and a source of M101 is connected to a power supply; and the transistors M107 and M108 are configured to shift a voltage of another control signal. The connection relation between the two transistors M107 and M10 refers to the connection between the transistors M101 and M102. The power supply of the voltage shift module 35 may be the output VO of the second selection module 33, that is, the high voltage level is shifted from VI_AUX to VO through voltage shift, and an initial state is provided for switches in the second selection module 33 during power-on of each power supply, so that both the output of the switches and the control signals are VO, and the switches are in a quasi diode connection mode, so as to prevent current from flowing between the switches during the power-on. Transistors M103, M104, M105, M106, M109, M110, M111, and M112 form two inverter chains, so as to form the drive module 34, for improving the driving capability of two control signals. M103 and M104 form an inverter, M105 and M106 form an inverter, and the two inverters form an inverter chain. This embodiment adopts two inverters as an inverter chain to improve the driving capability, and certainly, the number of stages of the inverters for driving in the inverter chain may be any even number.

The drive module between the control module 32 and the second selection module 33 may be omitted; instead, only the voltage shift circuit, as shown in FIG. 4b, which is a circuit configured to shift a voltage, is located between the control module 32 and the second selection module 33, that is, the voltage shift module 35 in FIG. 4b can shift the high voltage level of the control signal of each candidate power supply to a voltage of the output power supply, to implement initialization of the second selection module 33, thereby preventing charge flowing between different switches during the power-on and further optimizing the performance. The voltage shift module 35 may be formed by transistors M101 and M102, and obtain the output of the second selection module 33 as a power supply, so as to shift the high voltage level of the control signal from the preliminarily selected power supply voltage VI_AUX to the output voltage VO, thereby providing an initial state for switches of the second selection module 33 during the power-on, so that PMOS transistor switches in the second selection module 33 are similar as PMOS diodes whose gate and drain are connected to each other; in this way, reverse turn-on may not occur in the PMOS transistor switches, so that charge flowing between different switches may not occur at the power-on time. Certainly, other methods for providing an initial state for a switch may be found in the prior art, which is not described in detail in the embodiment of the present invention. Other possible means for providing an initial state for a switch should be considered as a part of the present invention or simple variations made to the present invention, as long as the means can achieve the function similar to the function of the voltage shift module 35. Persons skilled in the art can also make various improvements to the circuit structure in this embodiment without departing from the essence of the present invention.

Figure 10:
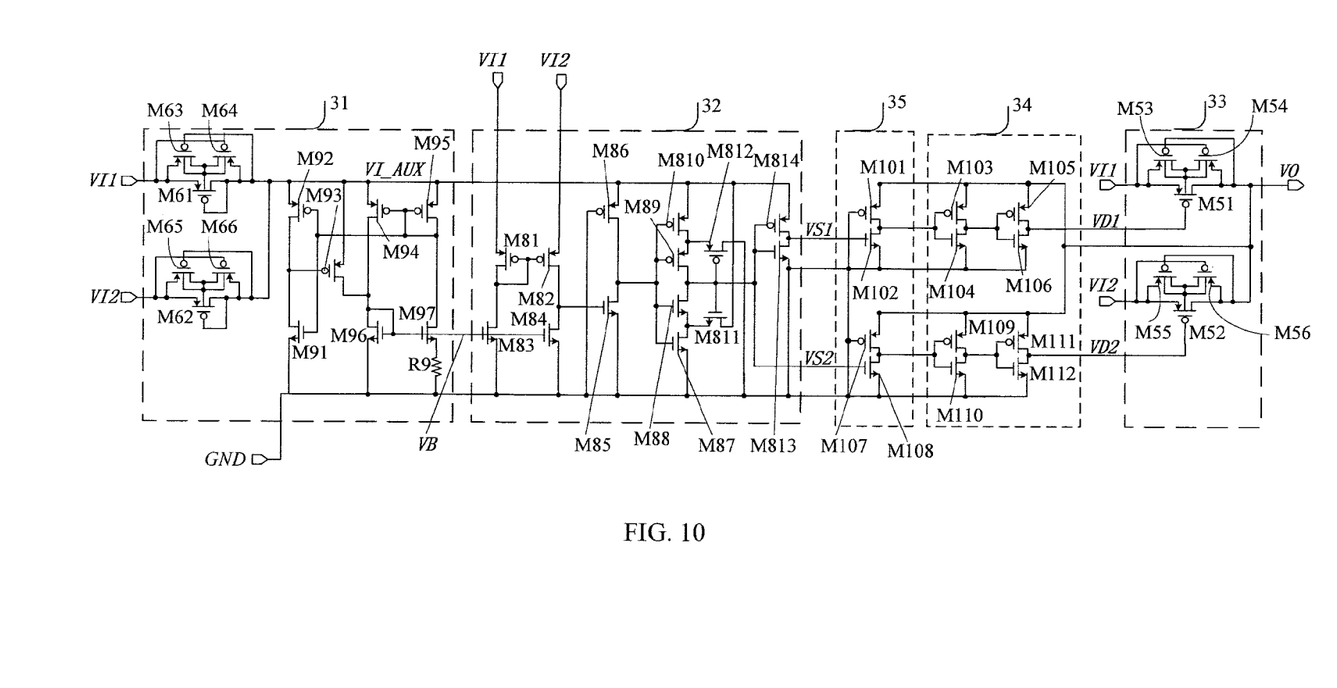
FIG. 10 is a schematic structural diagram of an embodiment of a two-power supply selector according to the present invention.

For the convenience of comprehension, an overall introduction is made to a specific structure of this embodiment, which includes a first selection module 31, a control module 32, a second selection module 33, a drive module 34, and a voltage shift module 35 as shown in FIG. 10. Please refer to the previous description for the specific structure and the function of each module. The first selection module 31 can implement the preliminary selection on two power supplies, but it has switches with a diode structure, so the output power supply may be affected by the voltage drop. The output is used to supply power for the control module 32, and the biasing circuit of the control module 32 is further integrated in the first selection module 31; please refer to the previous description for details. Therefore, the first selection module 31 not only implements preliminary selection on multiple candidate power supplies but also outputs a bias voltage VB to the control module 32, the control module 32 uses the preliminarily selected power supply as a power supply to generate control signals, the control signals can pass through the drive module 34 to improve the driving capability and are input to the subsequent stage, that is, the second selection module 33 for implementing final selection of the power supply, and the voltage shift module 35 may be located before the drive module 34 so as to shift the high voltage level of the control signals to the output VO, thereby providing an initial state for PMOS switches in the second selection module 33 during the power-on. The power supply selected through the embodiment is not affected by the voltage drop, no CP is needed, and the power consumption can be reduced.

In actual applications, this embodiment can be extended in many ways to form different implementation modes. The power supply selector not only can implement selection on two power supplies, but also can implement selection on more than two power supplies. Diodes of the first selection module 31 and the switch structure of the second selection module 33 may have alternative implementation means, for example, ordinary diodes, or PNP transistors in which the base and the collector are connected together may be adopted as the diodes in the first selection module 31; the second selection module 33 may adopt NMOS transistor switches, CMOS switches, transmission gates, and bipolar transistor switches. When the NMOS transistor switches are adopted, transmission of high voltage levels may have some loss, and the transmission effect is a little worse than that of the PMOS switches. The drive module 34 in this embodiment improves the driving capability through inverter chains, and other possible structures of the drive module 34 are not limited in this embodiment. The control module 32 in the power supply selector is configured to receive the power supply preliminarily selected in the preceding stage as a power supply without additional power supplies, and generate control signals by comparing the voltages of the candidate power supplies, and the comparator for implementing comparison of the power supply voltages may have various structures. This embodiment only provides an example, and the implementation of the comparator structure may adopt other structures in the prior art, such as a differential pair structure, which is not limited to this embodiment.

Figure 11:
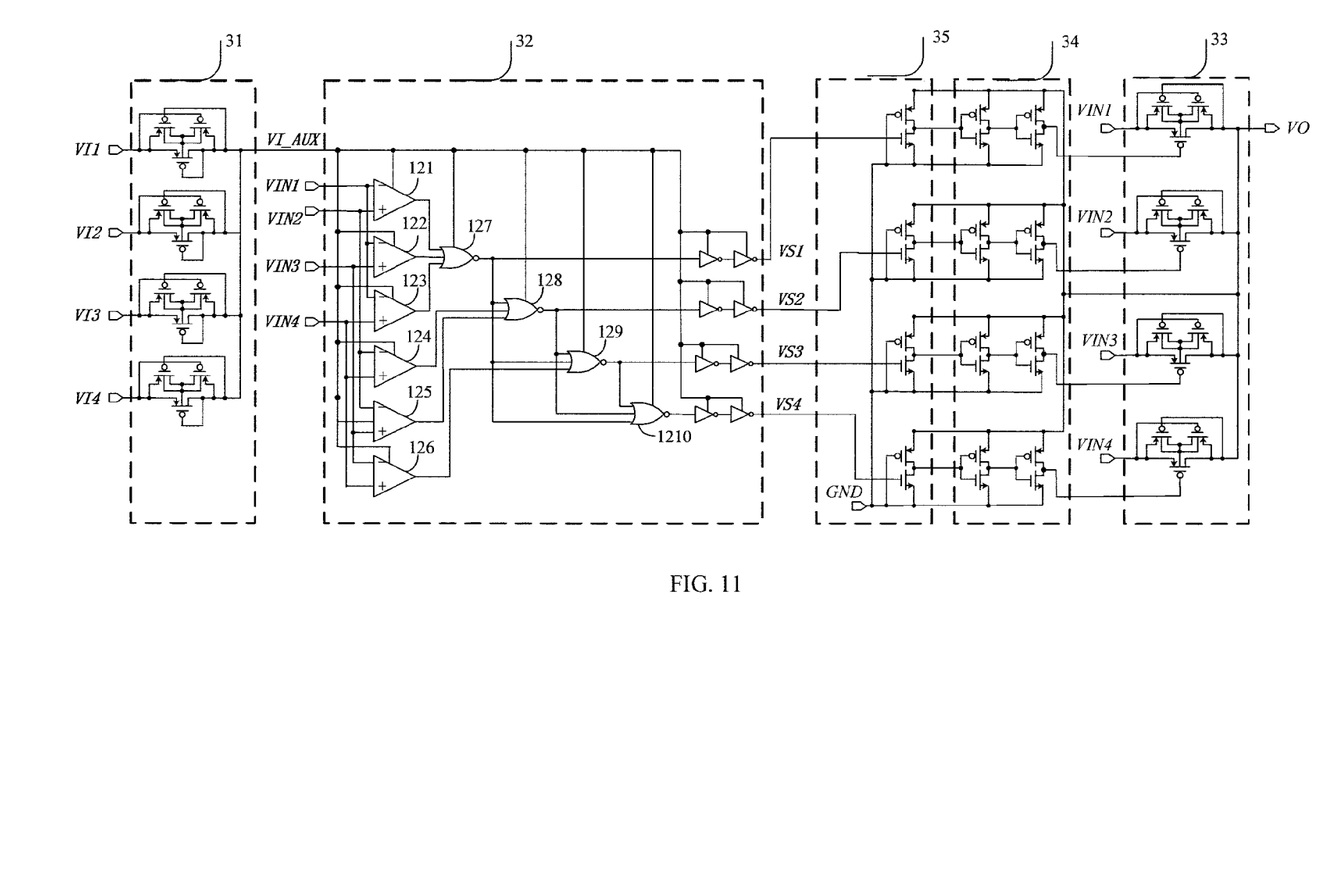
FIG. 11 is a schematic structural diagram of an embodiment of a four-power supply selector according to the present invention.

The above embodiment describes the case that one signal is selected from two signals, but such description is not intended to limit the present invention, for persons skilled in the art can increase the number of candidate power supplies according to requirements of actual applications, that is, extended the power supplies. FIG. 11 is a schematic structural diagram of an embodiment of a four-power supply selector according to the present invention. FIG. 11 shows another structure of the first selection module 31, configured to select one power supply from four candidate power supplies and having the same working principle as that in FIG. 6, except that the number of candidate power supplies is increased, which is not repeated in this embodiment. Corresponding to the first selection module 31 for implementing four-power supply selection in FIG. 11, FIG. 11 further shows a schematic structural diagram of a voltage shift module 35, a drive module 34, and a second selection module 33 for implementing the four-power supply selection. The drive module 34 receives four control signals, and the control signals whose driving capability improved by a drive circuit are employed to control a composite switch transistor to select a power supply. The voltage shift module 35 shifts the output high voltage level from VI_AUX to VO, and provides an initial state for switches in the second selection module 33 during the power-on of the power supplies, so as to prevent charge flowing between different switches. Inverter chains in the second selection module 33 improve the driving capability of the control signals, and the number of the driving stages is even. In addition, each switch is respectively designed with a voltage shift circuit and a drive circuit in FIG. 11; although circuit design overhead is increased, reverse flow of current may not occur during power-on of any power supply. The specific working principle has been described previously, and will not be shown herein again.

Because the control module 32 in FIG. 7 implements the two-power supply selection, the output result of the comparator is taken as a control signal. If the comparison of more than three signals is to be implemented, a logic unit may be added after a plurality of comparators, and the logic unit is configured to perform logic processing on the comparison results of the comparators to obtain control signals of the respective candidate power supplies. Correspondingly, FIG. 11 shows another implementation structure of the control module 32. In the control module 32 of FIG. 11, the circuit structure of the control module 32 includes six comparators, each one of the comparators is configured to compare two power supply voltages in the four power supplies, six comparison signals are generated, and the generated signals are input to a logic control circuit to generate control signals. The six comparators are respectively comparators 121, 122, 123, 124, 125, and 126, configured to compare two voltages of the four candidate power supply voltages VI1 to VI4; and the logic control circuit is formed by a NOR gate 127, a NOR gate 128, a NOR gate 129, and a NOR gate 1210. For example, VI1 is input to the comparators 121, 122, and 123; VI2 is input to the comparators 121, 124, and 125; VI3 is input to the comparators 122, 125, and 126; and VI4 is input to the comparators 123, 124, and 126. Four NOR gates 127, 128, 129, and 1210 follow the six comparators, and the logic unit formed by the four NOR gates processes the comparison results to obtain control signals. The NOR gate 127 takes the output of the comparators 121, 122, and 123 as the input; the NOR gate 128 takes the output of the comparators 124 and 125 and the output of the NOR gate 127 as the input; the NOR gate 129 takes the output of the comparator 126, the output of the NOR gate 127, and the output of the NOR gate 128 as the input; and the NOR gate 1210 takes the output of the NOR gate 127, the output of the NOR gate 128, and the output of the NOR gate 129 as three inputs. The control module 32 shown in FIG. 11 is configured to generate four control signals to make a selection from four candidate power supplies, and each generated control signal can be input to an even number of inverters to improve the driving capability, that is, an inverter chain connected behind the NOR gates 127, 128, 129, and 1210 respectively to improve the driving capability, as shown in FIG. 11, which is not limited in this embodiment. In the design of the comparator, if the input voltages of the comparator are close to each other, the comparator may be designed to output logic signal 1, and therefore, meaning indicated by logic 0 is definite, and the logic 1 may indicate the case that two inputs are very close. Consequently, in the design of a complicated logic circuit, voltages with a higher priority may be input from the negative end of the comparator, so as to ensure accuracy control of the power supplies with a higher priority. In specific implementations, six comparison signals can be processed through a logic circuit of priority to output four control signals. Such logic control can ensure that only one power supply is selected under any condition. The order of the priorities of four candidate power supplies in this embodiment may be VI1>VI2>VI3>VI4. When the values of the four power supply voltages are very close, it may be difficult for the comparator to differentiate the four power supply voltages, and the power supply of VI1 can be output preferentially. The power supply of the control module 32 may be provided by VI_AUX generated by the first selection module 31 in the preceding stage. In the control module 32 of FIG. 11, each comparator can adopt a structure similar to that of the comparator shown in FIG. 7, so as to implement comparison of two power supply voltages.

The above example introduces logic control for four power supplies, and the structure can be extended to any case of no less than three candidate power supplies in actual applications, which is not limited in this embodiment.

The control module 32 can implement the comparison of each two voltages in the multiple power supply voltages, and make the comparison signals pass through the logic circuit, so as to output control signals of respective power supplies, for controlling states of switches in the second selection module 33, so that only one switch in the second selection module 33 is turned on. The drive module 34 improves the driving capability of the control signals, and can further assign an initial state of the switches in the second selection module 33, so that the second selection module 33 can transmit the selected power supply efficiently.

Figure 12:
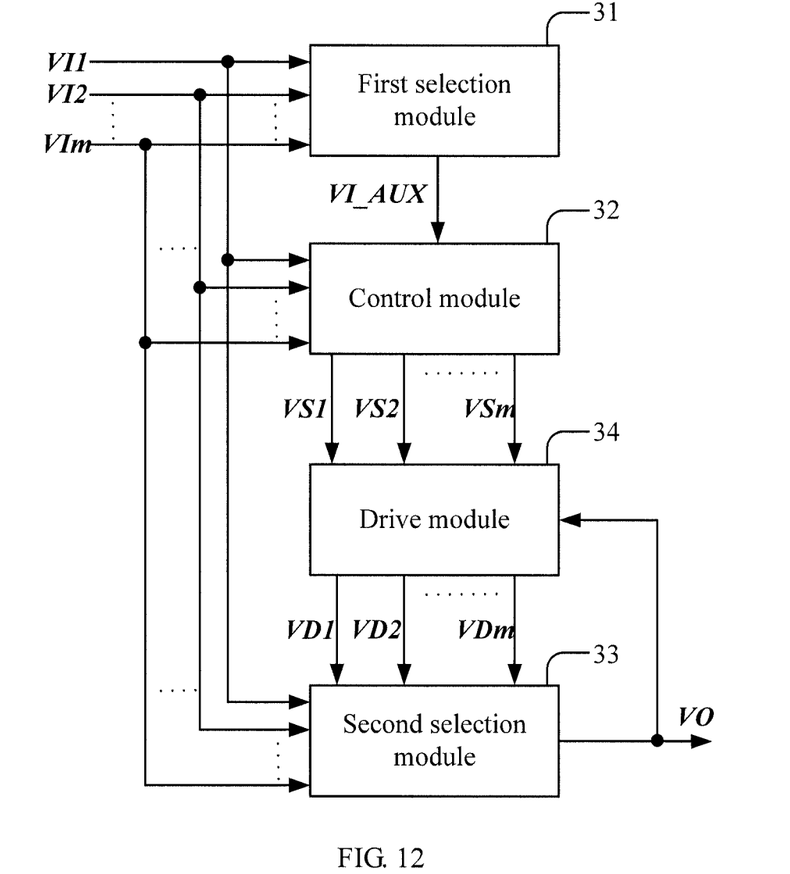
FIG. 12 is a schematic diagram of the working principle of a power supply selector according to an embodiment of the present invention.

FIG. 12 is a schematic diagram of the working principle of a power supply selector according to an embodiment of the present invention. Description is given below by taking the power supply selector selecting one power supply for output from m candidate power supplies (respectively being VI1, VI2, . . . , and VIm) as an example. The first selection module 31 makes a preliminary selection to obtain one power supply VI_AUX, and provides the power supply VI_AUX to the control module 32. As described above, a biasing circuit of the control module 32 can also be integrated in the first selection module 31, and provide a bias voltage VB for the control module 32. The control module 32 uses VI_AUX as a power supply, and compares m power supply voltages to generate corresponding control signals (respectively being VS1, VS2, . . . , and VSm). Control signals VD1, VD2, . . . , and VDm are output by passing the multiple signals VS1, VS2, . . . , and VSm through the drive module 34 to improve the driving capability. The second selection module 33 uses the control signals VD1, VD2, . . . , and VDm to make a final selection from the multiple candidate power supplies to obtain an output voltage VO, and VO can be fed back to the drive module 34, so that the drive module 34 can use VO as its own power supply.

In the embodiment of the present invention, a power supply selection circuit with a diode-connected PMOS transistor structure is configured to make a preliminary selection, which is easy to be integrated and implemented and that can prevent current from flowing between power supplies and provide a power supply and bias for a subsequent control circuit. The control circuit can implement the comparison between two voltages of the multiple power supply voltages, and comparison signals pass through a logic circuit to output control signals of corresponding power supplies for controlling states of switches in a subsequent selection circuit, so that only one switch is turned on at a time. The drive circuit is configured to improve the driving capability of the control signals, and meanwhile assign an initial state of switches in the subsequent selection circuit. The selection circuit can be formed by a plurality of MOS switches, transmit the selected power supply efficiently, and also supplies power for the output drive circuit.

In the prior art, the conventional drive circuit is usually supplied with power by an input voltage, and such a power supplying means may cause current flowing between power supplies during the power-on. The drive inverter chains are improved in one example of the present invention, and one stage of a voltage shift circuit is introduced in the preceding stage of the inverter chains. Such a design results in that the switch transistors are in the quasi diode connection way during the power-on of the power supply, so that current flowing between power supplies may not occur during the power-on of each power supply. Besides, the conventional drive circuit drives the switches in common, and the drive circuits of the switches are designed separately in this embodiment.

In the prior art, when ordinary diodes are adopted for power supply selection, the factor of system integrity should also be taken into account in addition to the voltage drop problem of the diodes. Schottky diodes usually become a preferred element of the power supply selection circuit with a diode structure due to its low voltage drop. However, common Schottky diodes are discrete elements, which are hard to be manufactured with a standard CMOS process and not easy to be integrated. In addition, the ordinary diodes in the standard CMOS process are mainly adopted to implement the electrostatic discharge (ESD) protection, and its performance is not as good as the performance of the discrete ordinary diodes; therefore, the ordinary diodes in the standard CMOS process are unsuitable for the power supply selection. However, the process complexity may be increased if the discrete ordinary diodes are used; therefore, the design of a CMOS process circuit without discrete diodes is important. One example of this embodiment can be implemented by using a CMOS integrated circuit process, and it has a high integration density. As a key module in a battery backup system, the performance of the multi-power supply selection circuit may directly decide the performance of the whole system. Moreover, it becomes significant that customers require the design of a fully integrated multi-power supply selection circuit based on a standard CMOS process because of the increase of requirements for system on chip (SOC) design. Meanwhile, due to the requirements of the low voltage and low power consumption, higher requirements are raised for the performance of the multi-power supply circuit in various aspects. Furthermore, the multi-power supply selection circuit in this embodiment of the present invention can be implemented based on an ordinary CMOS process, and has a high versatility. All apparatuses, units, and modules in this embodiment of the present invention can be implemented by using the CMOS process in whole or at least in part.

The conventional power supply selection circuit mainly chooses one supply from a backup battery supply and a main power supply, while a structure in this embodiment can be extended to any case of multiple input power supplies, which is easy to be extended and has a wider application area. Design of the drive module for each switch respectively makes the extension much easier.

Furthermore, the conventional power supply selection circuit based on switch transistors has a minimum value requirement for the voltage difference between the input power supplies, the difference is mainly decided by the offset voltage of the comparator. In one example of this embodiment of the present invention, by improving and optimizing the comparators, a fixed voltage is output in the case that voltages to be compared are infinitely close, and only one power supply is output at a time through control of a subsequent logic circuit based on a priority order, which simplifies the requirements for the input power supplies and extends the possible application range of the power supply selector.

Additionally, the leakage current of the diodes in the prior art may become a problem. The ordinary diodes and diode-connected MOS transistors based on the standard CMOS process both have a large substrate leakage current, which may reduce the current transmission efficiency of the power supply selection circuit. One example in this embodiment optimizes the switch substrate, for example, the switches in both the first selection module 31 and the second selection module 33 can adopt a composite transistor structure, and a circuit structure with optimized performance is introduced, so that the substrate voltage of the PMOS switch transistors is the same as the voltage of the end with a higher voltage in the source end and the drain end, so as to avoid turn-on of the substrate diodes and reduce a substrate leakage current.

The solution design of this embodiment can also reduce the power consumption and cost; although the area of the switch of the PMOS transistor is greater than the area of the switch of the NMOS transistor, the PMOS switch transistors have no voltage loss when producing high voltage levels, so as to reduce the power consumption of the system without adopting the CP and the clock circuit. The solution also can be implemented with elements adopting standard processes, so as to reduce the cost.

Figure 13:
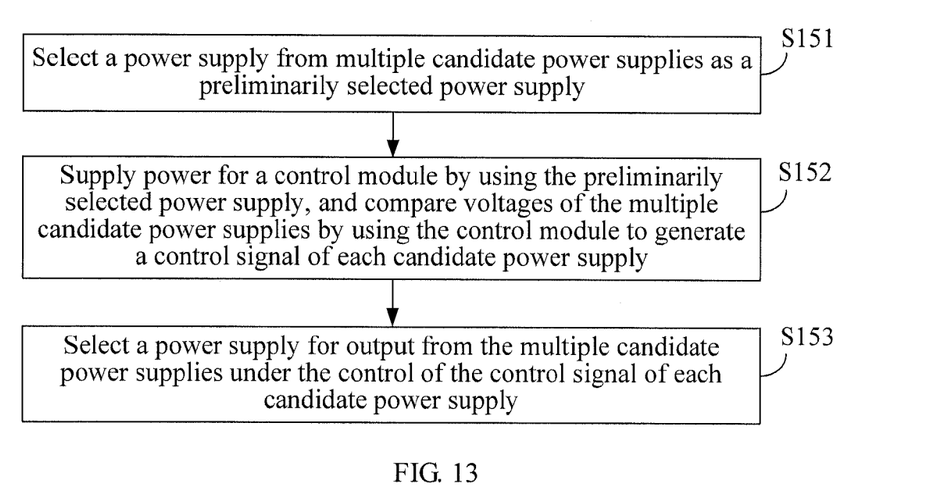
FIG. 13 is a schematic simplified flow chart of a power supply selection method according to an embodiment of the present invention.

An embodiment of the present invention further provides a power supply selection method, and the brief flow chart may be as shown in FIG. 13, and the method includes:

S151: Select a power supply from multiple candidate power supplies as a preliminarily selected power supply;

S152: Supply power for a control module by using the preliminarily selected power supply, and compare voltages of the multiple candidate power supplies by using the control module to generate a control signal of each candidate power supply; and S153: Select a power supply for output from the multiple candidate power supplies under the control of the control signal of each candidate power supply.

In this embodiment, a preliminary selection is made from multiple candidate power supplies to supply power for a subsequent control module, and the control module generates control signals for selecting a suitable power supply, which is easy to implement. Because the preliminarily selected power supply is to supply power for the control module rather than serving as a final output, the preliminarily selected power supply does not need to be very precise, and the control module can generate the control signals through a simple comparison function, which can reduce the power consumption without any complex circuit such as a CP, so as to control power supply selection through the control signals and finally implement accurate power supply selection. The finally selected power supply can be the supply with the largest voltage or the smallest voltage in the multiple candidate power supplies, or persons skilled in the art can select a power supply having a certain characteristic from the multiple candidate power supplies according to practical requirements, which is not described in details in this embodiment.

Persons of ordinary skill in the art should understand that all or a part of the processes of the method according to the embodiments of the present invention may be implemented by a computer program instructing relevant hardware. The program may be stored in a computer readable storage medium. When the program is run, the processes of the method according to the embodiments of the present invention are performed. The storage medium may be a magnetic disk, an optical disk, a Read-Only Memory (ROM), or a Random Access Memory (RAM).

The above descriptions are merely several embodiments of the present invention. Persons skilled in the art can make various modifications or variations to the present invention according to the disclosure of the application documents without departing from the spirit and the scope of the present invention. Persons of ordinary skill in the art should understand that the described embodiments or the features between different embodiments can be combined to form new embodiments in the case of no conflict.

What is claimed is:

1. A power supply selector, comprising:
   a first selection module, configured to receive multiple candidate power supplies and select a power supply from the multiple candidate power supplies as an internal power supply;
   a control module, coupled to the first selection module and configured to receive the multiple candidate power supplies, use the internal power supply as a power supply, and compare voltages of the multiple candidate power supplies to generate a control signal of each candidate power supply in the multiple candidate power supplies;
   a second selection module, coupled to the control module and configured to receive the multiple candidate power supplies, and select a power supply for output from the multiple candidate power supplies under control of the control signal of each candidate power supply;
   a voltage shift module, the second selection module coupled to the control module through the voltage shift module, and the voltage shift module is configured to obtain the power supply for output fed back by the second selection module as a power supply of the voltage shift module, and shift a high voltage level of the control signal of each candidate power supply to a voltage of the power supply for output; and
   a drive module, configured to obtain the control signal of each candidate power supply output by the voltage shift module, improve driving capability of the output control signal of each candidate power supply, and output the control signal of each candidate power supply with improved driving capability to the second selection module.

2. The power supply selector according to claim 1, wherein the drive module comprises at least one inverter chain; and
   each of the at least one inverter chain is configured to improve driving capability of a control signal of a candidate power supply and output the control signal of the candidate power supply to the second selection module.

3. The power supply selector according to claim 1 wherein the first selection module comprises a plurality of diodes, cathodes of the plurality of diodes are coupled to each other to serve as an output of the first selection module, and an anode of each diode is configured to receive a power supply in the multiple candidate power supplies.

4. The power supply selector according to claim 3, wherein at least one diode in the plurality of diodes is a p-channel metal oxide semiconductor (PMOS) diode with a gate and a drain connected to each other.

5. The power supply selector according to claim 4, wherein the first selection module further comprises at least one first performance optimization unit coupled to a substrate, an anode, and a cathode of the at least one PMOS diode; and the first performance optimization unit is configured to adjust a substrate voltage of the PMOS diode to a higher voltage in an anode voltage and a cathode voltage of the PMOS diode.

6. The power supply selector according to claim 5, wherein the first performance optimization unit comprises a third PMOS transistor and a fourth PMOS transistor; a source of the third PMOS transistor is coupled to a gate of the fourth PMOS transistor; a source of the fourth PMOS transistor is coupled to a gate of the third PMOS transistor; the source of the third PMOS transistor is coupled to the anode of the PMOS diode; and the source of the fourth PMOS transistor is coupled to the cathode of the PMOS diode; and
   a substrate of the third PMOS transistor, a substrate of the fourth PMOS transistor, a drain of the third PMOS transistor, a drain of the fourth PMOS transistor, and the substrate of the PMOS diode are connected to each other.

7. The power supply selector according to claim 1, wherein the control module comprises: a comparator, configured to compare voltages of two power supplies in the multiple candidate power supplies to obtain a control signal of a power supply in the two power supplies.

8. The power supply selector according to claim 7, wherein the comparator comprises a fifth PMOS transistor, a sixth PMOS transistor, and a voltage shift circuit;
   a gate of the fifth PMOS transistor and a gate of the sixth PMOS transistor are connected to each other, a drain of the fifth PMOS transistor and a drain of the sixth PMOS transistor are connected to two current sources respectively, the drain and the gate of the fifth PMOS transistor are connected to each other, a source of the fifth PMOS transistor and a source of the sixth PMOS transistor receive the two power supplies respectively to compare voltages of the two power supplies, and the drain of the sixth PMOS transistor outputs a comparison result; and
   the voltage shift circuit is configured to receive the power supply selected by the first selection module as a power supply, and shift a high voltage level in the comparison result to a voltage of the power supply selected by the first selection module to obtain the control signal of the power supply in the two power supplies.

9. The power supply selector according to claim 8, wherein the two current sources connected to the drain of the fifth PMOS transistor and the drain of the sixth PMOS transistor respectively in the control module are n-channel metal oxide semiconductor (NMOS) transistor current sources; and a biasing unit is integrated in the first selection module and configured to provide a bias voltage from the first selection module for gates of the NMOS transistor current sources.

10. The power supply selector according to claim 1, wherein the control module comprises a plurality of comparators and a logic unit; each of the comparators is configured to compare voltages of two power supplies in the multiple candidate power supplies respectively to obtain a comparison result; and the logic unit is coupled to the plurality of comparators, and is configured to: obtain the comparison results of the plurality of comparators and perform logic processing on the comparison results of the plurality of comparators to obtain the control signal of each candidate power supply.

11. The power supply selector according to claim 10, wherein the multiple candidate power supplies comprise a first power supply, a second power supply, a third power supply, and a fourth power supply;
the plurality of comparators comprises: a first comparator, configured to receive the first power supply through a negative input end and receive the second power supply through a positive input end; a second comparator, configured to receive the first power supply through a negative input end and receive the third power supply through a positive input end; a third comparator, configured to receive the first power supply through a negative input end and receive the fourth power supply through a positive input end; a fourth comparator, configured to receive the second power supply through a negative input end and receive the fourth power supply through a positive input end; a fifth comparator, configured to receive the second power supply through a negative input end and receive the third power supply through a positive input end; and a sixth comparator, configured to receive the third power supply through a negative input end and receive the fourth power supply through a positive input end;
the logic unit comprises: a first NOR gate, configured to take an output of the first comparator, an output of the second comparator, and an output of the third comparator as inputs, and output a control signal of the first power supply; a second NOR gate, configured to take an output of the first NOR gate, an output of the fourth comparator, and an output of the fifth comparator as inputs, and output a control signal of the second power supply; a third NOR gate, configured to take an output of the first NOR gate, an output of the second NOR gate, and an output of the sixth comparator as inputs, and output a control signal of the third power supply; a fourth NOR gate, configured to take an output of the first NOR gate, an output of the second NOR gate, and an output of the third NOR gate as inputs, and output a control signal of the fourth power supply; and
each of the comparators is configured to output a logic high voltage level when a difference between compared voltages of two power supplies is less than a predetermined value; and output priorities of the first power supply, the second power supply, the third power supply, and the fourth power supply are decreased from high to low.

12. The power supply selector according to claim 1, wherein the second selection module comprises a plurality of switches; and each of the switches is configured to receive a candidate power supply and a control signal of the candidate power supply, and decide whether to output the candidate power supply according to the control signal of the candidate power supply.

13. The power supply selector according to claim 12, wherein at least one switch in the plurality of switches is a PMOS transistor switch.

14. The power supply selector according to claim 13, wherein
the second selection module further comprises at least one second performance optimization unit coupled to a substrate, an input end, and an output end of the at least one PMOS transistor switch; and
the second performance optimization unit is configured to adjust a substrate voltage of the PMOS transistor switch to a higher voltage in an input end voltage and an output end voltage of the PMOS transistor switch.

15. The power supply selector according to claim 14, wherein the second performance optimization unit comprises a first PMOS transistor and a second PMOS transistor;
a source of the first PMOS transistor is coupled to a gate of the second PMOS transistor;
a source of the second PMOS transistor is coupled to a gate of the first PMOS transistor;
the source of the first PMOS transistor is coupled to the input end of the PMOS transistor switch;
the source of the second PMOS transistor is coupled to the output end of the PMOS transistor switch; and
a substrate of the first PMOS transistor, a substrate of the second PMOS transistor, a drain of the first PMOS transistor, a drain of the second PMOS transistor, and the substrate of the PMOS transistor switch are connected to each other.

16. The power supply selector according to claim 1, wherein the power supply for output selected by the second selection module is a power supply with the highest voltage in the multiple candidate power supplies.

* * * * *